United States Patent [19]
Keller et al.

[11] Patent Number: 5,650,032
[45] Date of Patent: Jul. 22, 1997

[54] APPARATUS FOR PRODUCING AN INDUCTIVE PLASMA FOR PLASMA PROCESSES

[75] Inventors: John Howard Keller, Newburgh, N.Y.; Michael Scott Barnes; John Curt Forster, both of San Francisco, Calif.; John Edward Heidenreich, III, Yorktown Heights, N.Y.

[73] Assignee: International Business Machines Corporation, Armonk, N.Y.

[21] Appl. No.: 467,352

[22] Filed: Jun. 6, 1995

[51] Int. Cl.[6] .................................................. H05H 1/00
[52] U.S. Cl. ................. 156/345; 118/723 I; 204/298.08; 204/298.34
[58] Field of Search .................... 156/345; 118/723 I, 118/723 IR; 204/298.34, 298.31, 298.08; 315/111.21

[56] References Cited

U.S. PATENT DOCUMENTS 5,531,834 7/1996 Ishizuka et al. .................. 156/345
5,560,776 10/1996 Sugai et al. ................... 118/723 I X

*Primary Examiner*—Thi Dang
*Attorney, Agent, or Firm*—Whitham, Curtis, Whitham & McGinn

[57] ABSTRACT

An efficient RF coil for inductively coupled plasmas provides either capacitive or inductive coupling to the plasma. The coil has a layered structure including at least one RF coil, an insulator having a low dielectric constant and a second RF magnetic structure. The second RF magnetic structure may be either a second RF coil or a Faraday shield. In a two coil structure, the first RF coil has a first magnetic sense upon energization by an RF source, and the second RF coil has a second magnetic sense opposite the first magnetic sense. An RF source is connected to the high voltage ends of the two RF coil. Uniform capacitive coupling is achieved by the use of a Faraday shield located between the RF coil and the plasma.

26 Claims, 9 Drawing Sheets

APPARATUS FOR PRODUCING AN INDUCTIVE PLASMA FOR PLASMA PROCESSES

BACKGROUND OF THE INVENTION

1. Field of the Invention

The present invention generally relates to plasma processing of semiconductor wafers in the manufacture of integrated circuits (ICs) and, more particularly, to an apparatus for producing an inductive plasma for plasma processes, the apparatus having an improved radio frequency (RF) layered coil structure for inductively coupled plasmas (ICPs) which permits a certain amount of capacitive coupling to the plasma.

2. Background Description

Plasma processing is an indispensable technology in the manufacture of very large scale integrated (VLSI) circuits. Plasma-assisted etching techniques have replaced chemical etching, and sputtering has replaced evaporation for the deposition of metals. Plasma enhanced chemical vapor deposition (PECVD) is an alternative to conventional low pressure CVD techniques.

In some plasma processing applications of inductive plasmas, a nearly pure inductive plasma is desired, while in others, more capacitive coupling is desired. In presently used coils, there is a theta variation to the induced plasma current near the outer end of the RF coil. In most applications, the most efficient RF coil is desired. This is particularly true if some confinement of the plasma is being used near the RF coil which reduces the magnetic coupling coefficient of the RF coil.

The current design of inductively driven plasma sources does not address the issue of capacitive coupling to the plasma. This leads to nonuniformities in processing when dealing with polymerizing chemistries, and chemistries that have high activation energies.

SUMMARY OF THE INVENTION

It is therefore an object of the present invention to provide an apparatus for producing an inductive plasma, the apparatus having an improved RF coil structure for inductively coupled plasmas in integrated circuit manufacturing processes.

It is another object of the invention to provide an apparatus for plasma processes including an RF coil for inductively coupled plasmas which permits a certain amount of capacitive coupling to the plasma.

It is a further object of the invention to provide, in an apparatus for plasma processing, an RF coil for generating a low pressure inductively coupled plasma which promotes uniformity in processing wafers when dealing with selective or polymerizing chemistries.

According to the invention, there is provided an apparatus for producing an inductive plasma used for plasma processing of a workpiece, which apparatus comprises a vacuum chamber including means within the chamber to receive a workpiece, such as a semiconductor wafer, to be processed by a plasma. An RF induction coil structure is formed of at least first and second layers separated by an insulator of sufficient thickness to prevent electrical breakdown within the coil structure. An RF source is connected to the first layer of the RF induction coil structure. The RF induction coil structure generates an inductive plasma within the vacuum chamber when energized by said RF source. A reactive impedance is connected to the second layer of the RF induction coil structure and isolates the RF induction coil structure from ground. The reactive impedance controls the amount of RF voltage on the layer closest to the plasma.

The invention may be implemented in several embodiments. The RF coil structure can be built in layers above or outside of a dielectric window in the vacuum chamber, the dielectric window separating the layered coil structure from the plasma. The layered structure permits the number of turns in the coil can be increased which in turn increases the "Q" of the coil without affecting the voltage which the plasma "sees". For more pure inductive plasmas, the low voltage (symmetrically driven) end of the coil is placed nearest the plasma. When more capacitive coupling is desired, the higher voltage end is placed nearest the plasma. The additional turns now take the place of the large inductor presently used in the matching network.

In addition, the invention makes the outer turn of the coil structure nearly circular running from one layer to the next layer, thus making the theta variation of the induced plasma much smaller. The coil structure can be powered from the center of the two coils. The two coils are wound oppositely and connected so their magnetic fields in the plasma add.

Alternatively, the coil layers may be connected by a lumped capacitor or by a distributed capacitor, as opposed to being directly connected. In the case of a lumped capacitor, the effects on the impedance, of the dielectric layer between the coils, is reduced by more than a factor of two. If the dielectric layer itself is used as the capacitive connection, then the voltage along one layer of the coil structure can be reduced by a factor of two and, in the limit, reduced to almost zero by using a partial layer of coils. In the second case, the distributed capacitive layer may be used to produce a slow wave structure so as to produce an electric field in the radial direction of the plasma, Er, in the case of planar coil. The radial electric field, Er, further reduces the thermal and directed radial ion velocity of the plasma ions.

In selective processes and in processes which produce a polymer, one wants to keep the dielectric window clean so as to reduce the problem of flaking from the window. Some uniform capacitive coupling will heat the window and also sputter or reactive ion etch (RIE) clean the window. Thus, it is often desirable to mix inductive and capacitive coupling in the application of high density plasma sources to etching with selective or polymerizing gas mixtures. One problem that arises is the uniformity of the inductive and capacitive coupling.

In the practice of the invention, uniform inductive coupling is achieved by proper coil design. For planar coils, the inductance can be reduced in the middle and increased on the outside and possibly in the center. Uniform capacitive coupling is achieved by capacitive coupling of a pair of RF spiral coils or through the use of a Faraday shield located between the induction coil and the plasma. If a pair of coils is used, the coil nearest the dielectric window can be a double or triple spiral or a solenoid coil in order to reduce the voltage variation along the coil, thus making capacitive coupling more uniform.

When a Faraday shield is used in the RF coil structure, this Faraday shield may be electrically attached to the high voltage end of the coil, maximizing the amount of capacitive coupling. By varying the reactive coupling of the coil to ground, the RF voltage on the Faraday shield can be adjusted to the desired value for the plasma process. The design of the Faraday shield is important. It does not "steal" current from the induction coil, which leads to nonuniformities in the inductive coupling.

In a one embodiment, a connection point to the coil is placed off center, leading to improved uniformity. Another embodiment has the shield driven by a variable reactance and grounded by another variable reactance, allowing the Faraday shield drive to be controlled.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
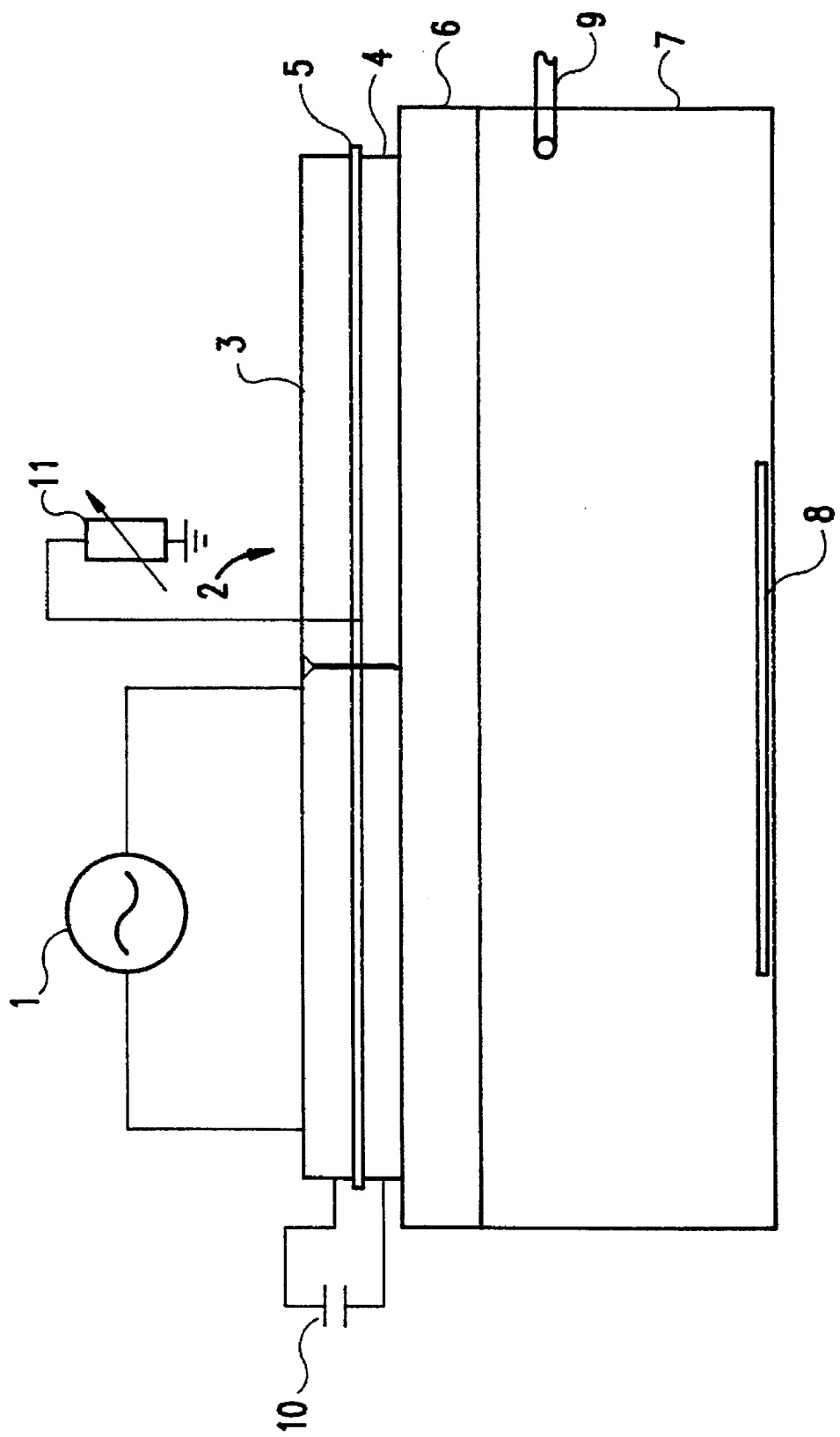
FIG. 1 is a schematic block diagram showing a first embodiment of the present invention using two RF spiral coils.

Referring now to the drawings, and more particularly to FIG. 1, there is shown a first embodiment of the present invention. An RF source 1 provides an energizing signal to the RF coil 2. The RF source 1 typically consists of an RF generator and a matching network. The RF coil 2 is a layered structure comprising a first spiral coil 3 and a second spiral coil 4 separated by an insulator 5 having a low dielectric constant. The RF coil 2 is placed on the dielectric window 6 of a vacuum chamber 7 in which a wafer or workpiece 8 to be processed is positioned. A gas is introduced to the chamber 7 by way of a conduit 9, this gas being the source of the plasma when the RF source 1 energizes the RF coil 2.

The magnetic fields generated by the two spiral coils 3 and 4 when energized add together in the plasma. The outer portions of the RF spiral coils 3 and 4 are connected together. The low voltage end of the RF spiral coil 4 may be placed closest to the plasma to reduce capacitive coupling. For an increase in capacitive coupling, the high voltage end may be placed closest to the plasma. To provide the desired degree of capacitive coupling to the plasma, the coupling of the RF spiral coils 3 and 4 may be made with a capacitor 10, which may be either a lumped capacitor or a distributed capacitance. A reactive impedance 11 is connected between the second coil 4 and ground. The impedance 11 may be a variable reactance which can be adjusted to control the amount of RF voltage on the spiral coil 4 closest to the plasma.

In a specific implementation of the invention, the coils 3 and 4 are fabricated as planar copper spirals approximately ¼" thick, and the insulator 5 is a Teflon® polymer film, also approximately ¼" thick. A nearly circular outer coil of copper connects the two spirals. The spirals of the coils are wound oppositely to one another; that is, one is a clockwise spiral while the other is a counter clockwise spiral. They are connected so that their magnetic fields add in the plasma.

Figure 2:
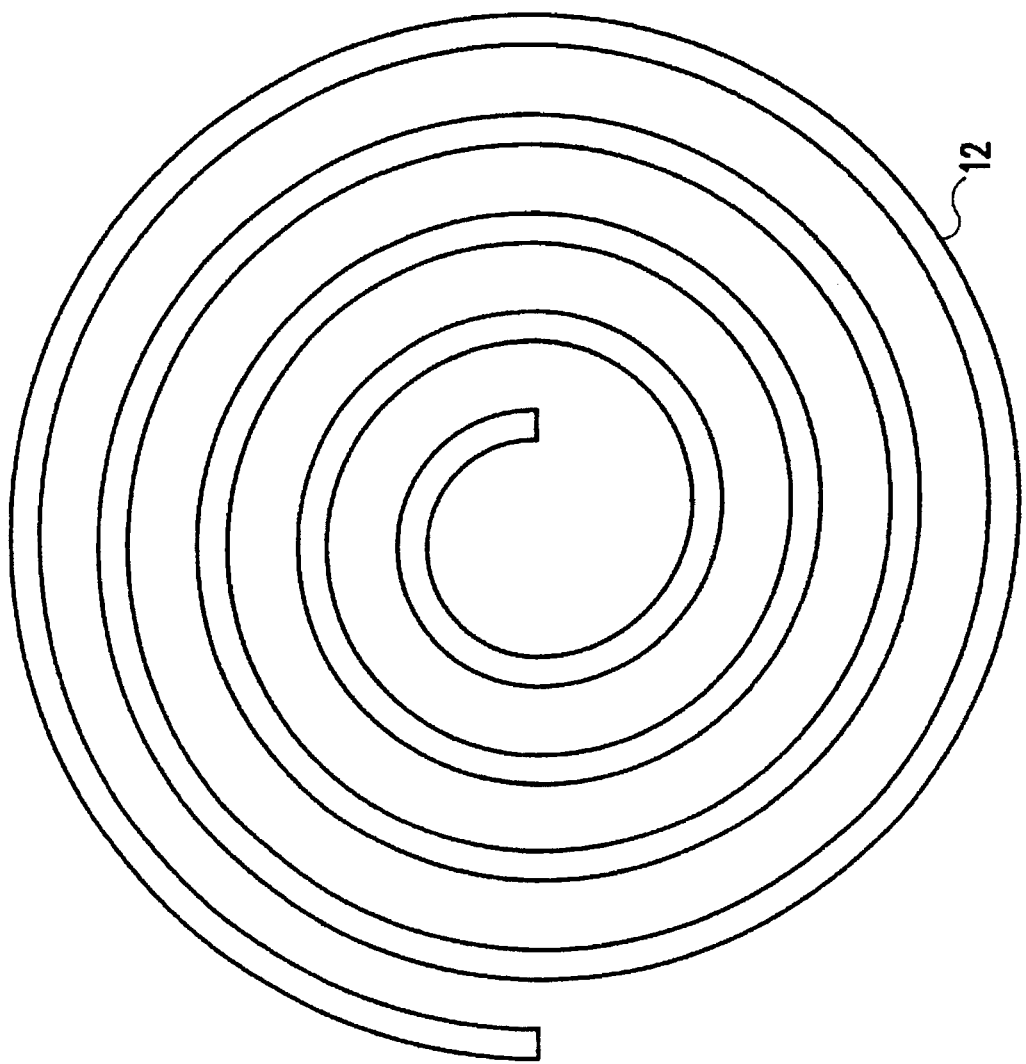
FIG. 2 is a plan view of a spiral coil of the type that may be used in the embodiment shown in FIG. 1.
Figure 3:
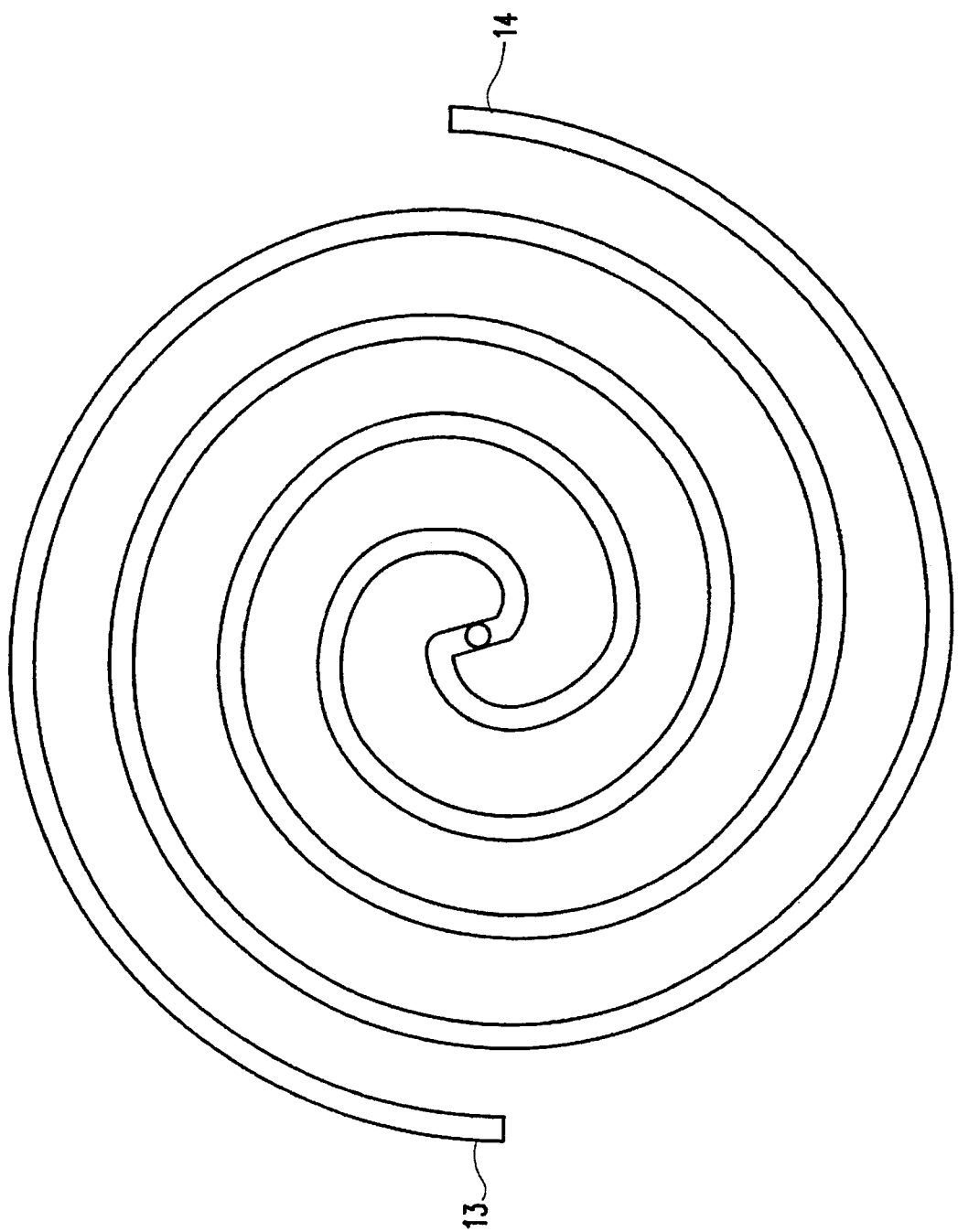
FIG. 3 is a plan view of a double spiral coil of the type that may be use in the embodiment shown in FIG. 1.

Coils which may be used in this invention are shown in FIGS. 2, 3, 4, and 5. FIG. 3 is a plan view of a single spiral coil 12. Such a coil will put more power into the plasma near the center annulus of the coil. This coil may be modified for better inductive uniformity by decreasing the spacing between the turns near the inner most part of the coil and near the outer part of the coil. Thus, the inductance per unit length on the inside and on the outside will be increased relative to that in the center annulus. Also, if the plasma density is larger near the center of the coil, the turns on the outside may be made closer. Similarly, the web width may be made smaller on the outside as shown in U.S. Pat. No. 5,304,279.

A double spiral coil, such as shown in FIG. 3, will have less voltage variation along the coil than the coil shown in FIG. 2, if the two arms 13 and 14 of the spiral are driven in parallel at the same RF current.

Figure 4:
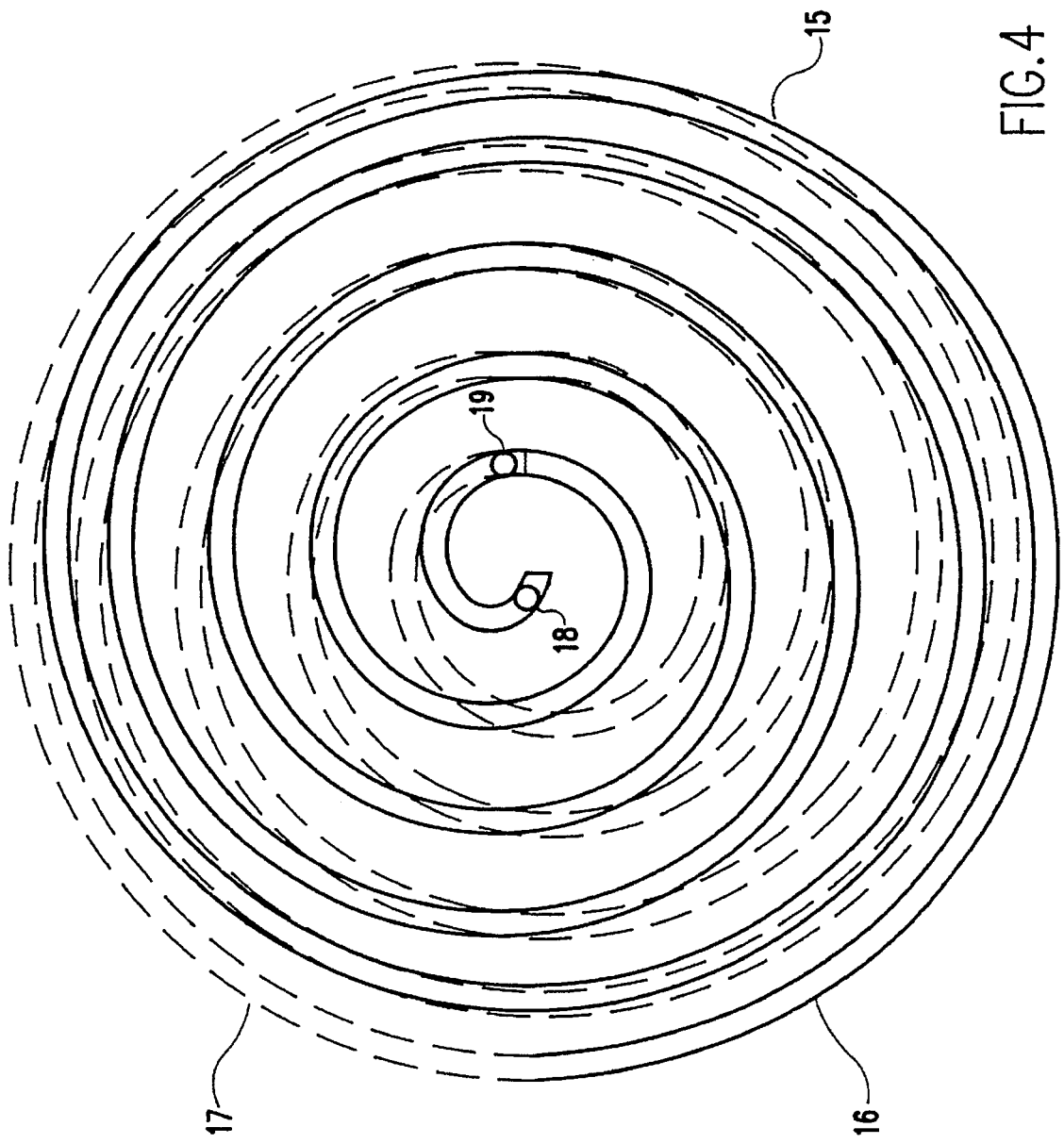
FIG. 4 is a plan view showing one example of two layered spiral coils of the type shown in FIG. 2 as used in the embodiment shown in FIG. 1.

Either of or a combination of both the coils shown in FIGS. 2 and 3 may be used in making the layered structure of the RF coil according to the first embodiment of invention shown in FIG. 1. As one example, the coil of this invention may be made as shown in FIG. 4. In this example, a two layer coil is represented with the coil 15 in solid line being closest to the plasma and the other, coaxial coil 16 being shown in dotted line. An insulator (not shown) separates the two coils 15 and 16. The coil 15 is formed similarly to the coil shown in FIG. 2, except with one half more turns at the center, turned over so that it forms a spiral with the opposite sense and joined to the spiral on the outside. The coil 16 is basically identical to the coil shown in FIG. 2. Note that the spiral of coil 15 is a clockwise spiral, while the spiral of coil 16 is a counter clockwise spiral.

The two spirals may be joined by a conductor, by a capacitor or the ends of the spirals may be bent so that it forms a smooth transition 17, as specifically illustrated in FIG. 4. The coils 15 and 16 are connected to the RF source 1 at terminals 18 and 19, respectively.

Figure 5:
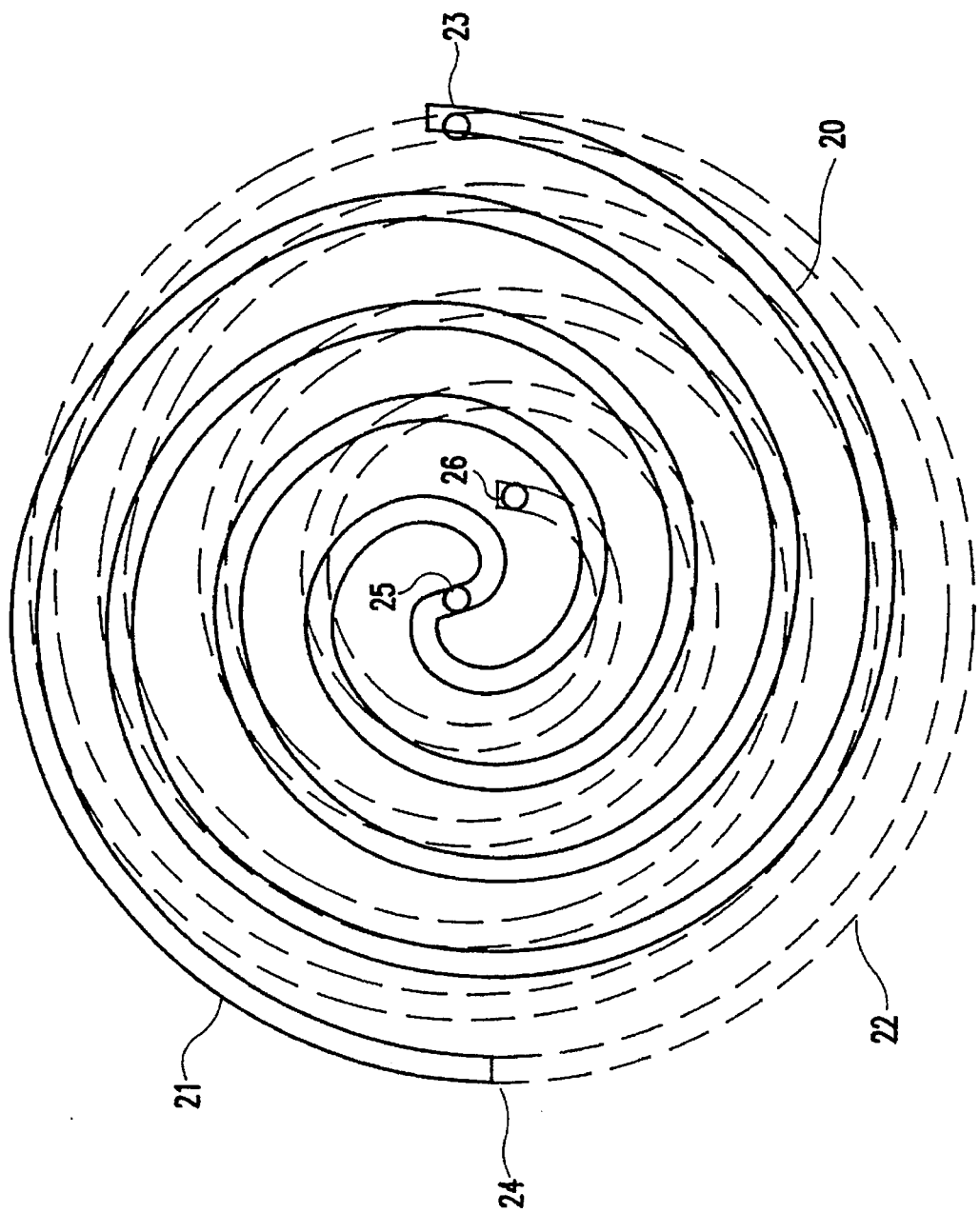
FIG. 5 is a plan view showing another example of two layered spiral coils of the types shown in FIGS. 2 and 3 as used in the embodiment shown in FIG. 1.

FIG. 5 shows an alternative two layer coil structure. Again, in FIG. 5 the coil nearest the plasma is indicated by solid lines and the second, coaxial coil is indicated by dotted lines. The first coil is a double spiral coil, like that of FIG. 3, having arms 20 and 21. The second coil 22 is a single spiral coil like that of FIG. 2. The outer parts of the two spiral coils may be joined by a conductor or a capacitor. Note that the double spiral coil is connected to the single spiral in two places 23 and 24 at the ends of the two spiral arms 20 and 21, respectively. RF contact is made at terminals 25 shown in the center of the double spiral coil and 26 at the inside of the single spiral coil.

Figure 6:
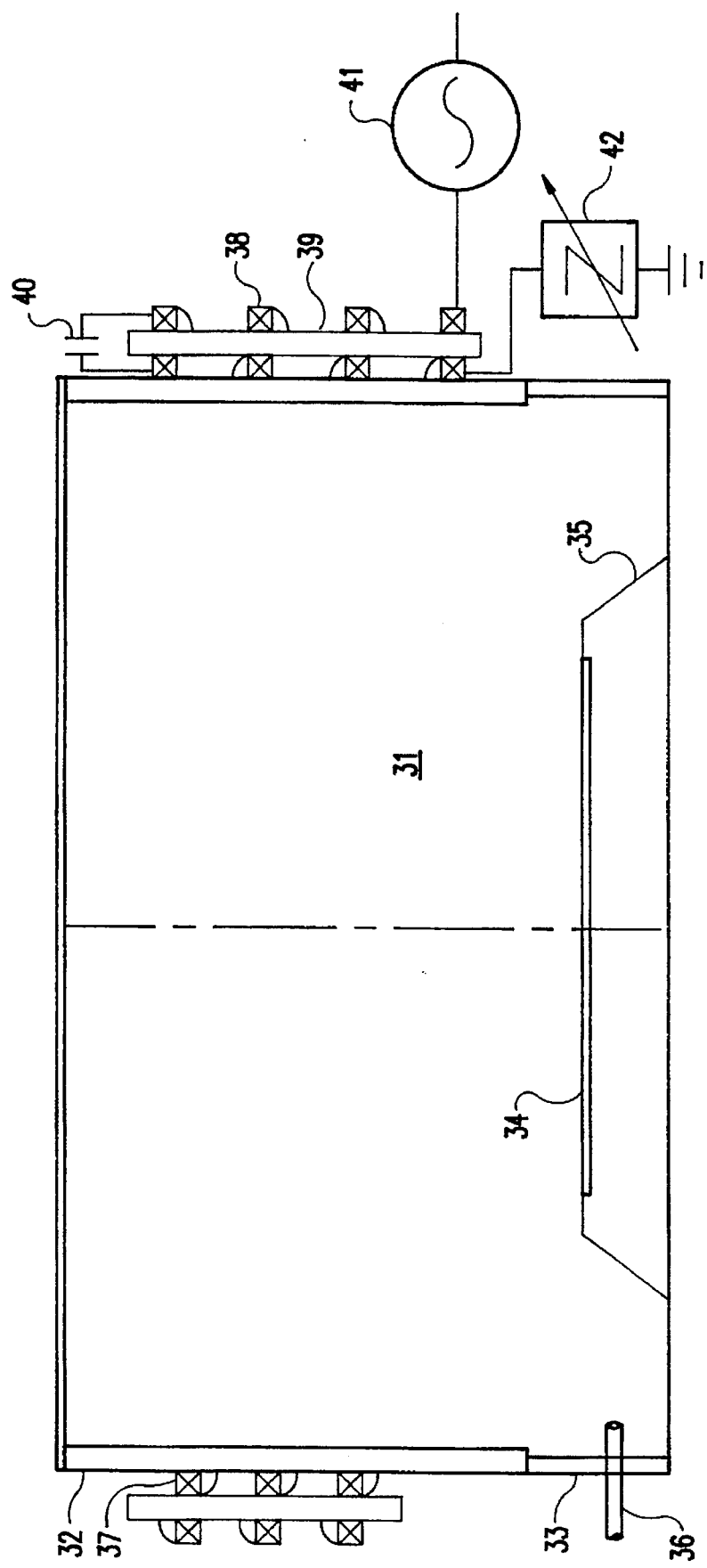
FIG. 6 is a schematic block diagram showing a second embodiment of the invention using two RF solenoidal coils.

In the second embodiment shown in FIG. 6, the plasma chamber 31 has a generally cylindrical shape, including the dielectric window 32 and vacuum wall 33. Within the plasma chamber are a wafer or workpiece 34 held by a chuck 35. A conduit 36 is used to introduce the gas from which the plasma is generated.

The first RF coil 37 is wound as a solenoid, or cylindrical, coil about the dielectric window 32 and is closest to the plasma. The second RF coil 38, also wound as a solenoid, is separated from the first RF coil by an insulating layer 39. As in the first embodiment, the two coils may be directly connected or connected by a capacitor 40. An RF source 41 is connected to the outer second coil 38, and a reactive impedance 42 is connected between the inner first coil 37 and ground. Again, the impedance 42 may be a variable reactance.

Figure 7:
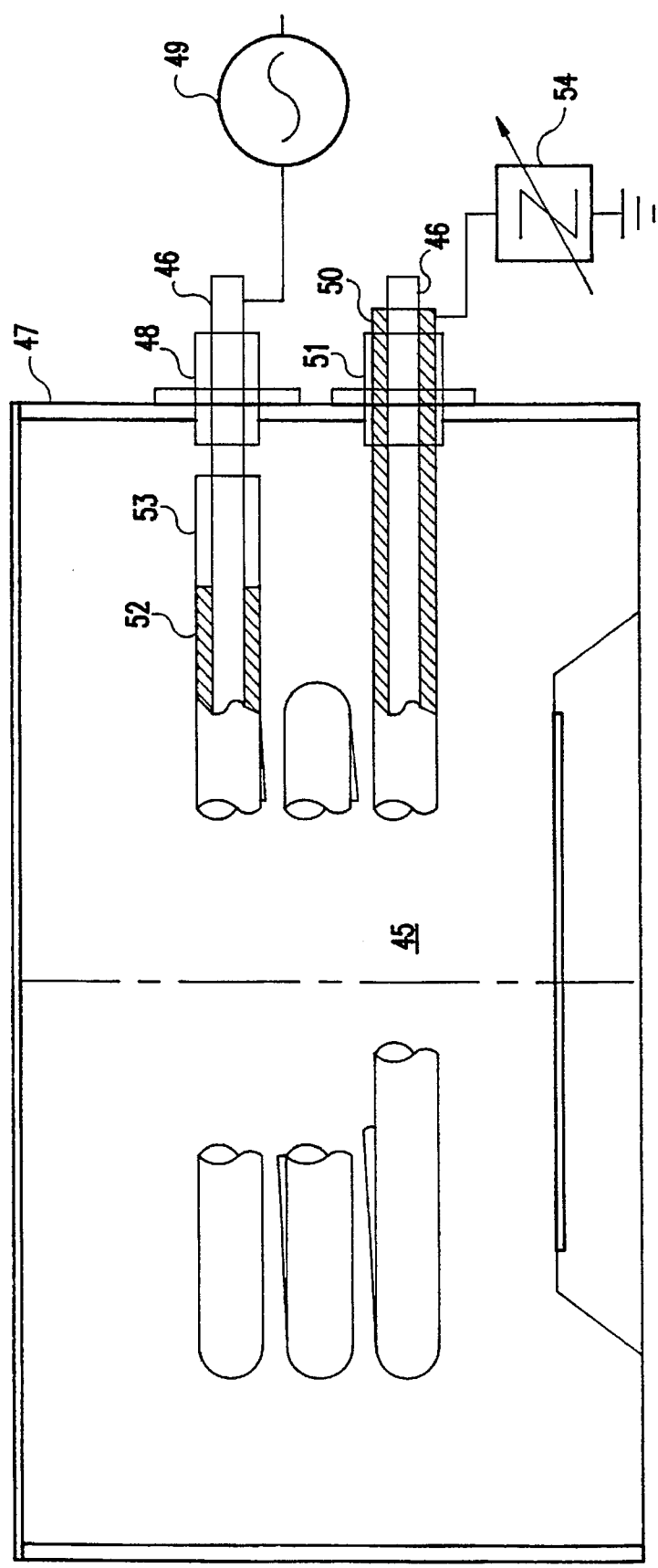
FIG. 7 is a schematic block diagram showing a third embodiment of the invention in which the layered RF coil structure is placed in the plasma.

FIG. 7 shows the third embodiment of the invention which, again, uses two coils, but these coils are within the chamber 45 and hence within the plasma. The coils are formed of different diameter coaxial tubes. A water cooled tube 46 forms the inner coil layer. One end of the tube 46 passes through the vacuum wall 47 of the plasma chamber via an RF vacuum feed through 48 and is connected to an RF source 49. The other end of inner coil together with an end of an outer, coaxial tube 50, forming the outer RF coil layer, pass through the vacuum wall 47 via another RF vacuum feed through 51. The inner coil layer 46 is separated from the outer coil layer 50 by an insulating layer 52. The insulating layer does not extend to the end of the outer coil layer 50 within the plasma chamber 45 but is instead recessed therefrom, forming a shadow structure 53 to protect the insulating layer 52 from being coated by a conducting material.

In the illustration shown, the RF coils are formed in a solenoidal layered structure as in the embodiment shown in FIG. 6; however, a planar layered structure as in the first embodiment may be used. In either case, the inner and outer coils may be directly connected or connected by a capacitor (not shown). In addition, the end of the outer coil 50 which projects through the RF vacuum feed through 51 is connected to ground through a reactive impedance 54. Again, the impedance 54 may be a variable reactance.

Figure 8:
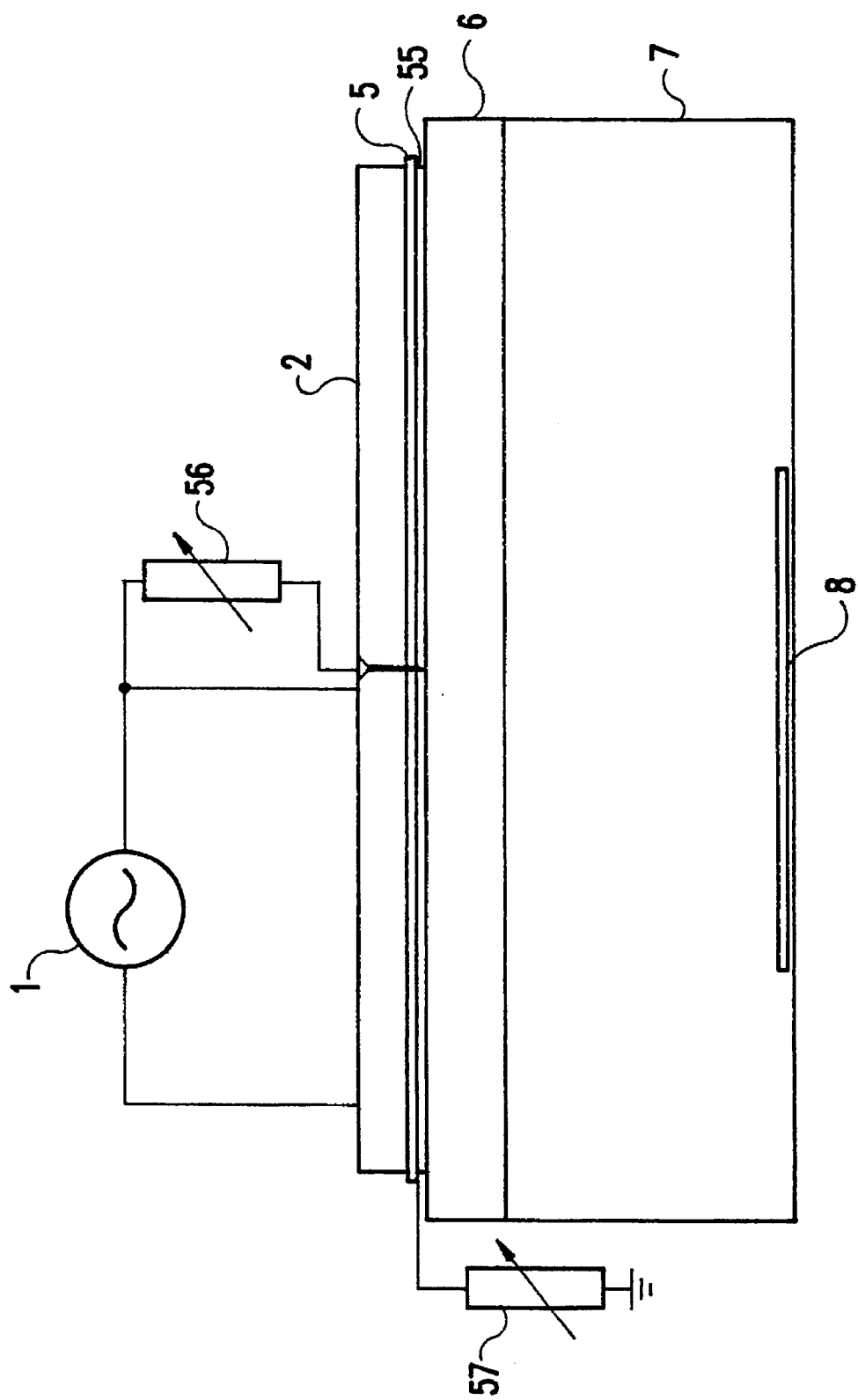
FIG. 8 is a schematic block diagram showing a second embodiment of the present invention using an RF spiral coil and a Faraday shield.
Figure 9:
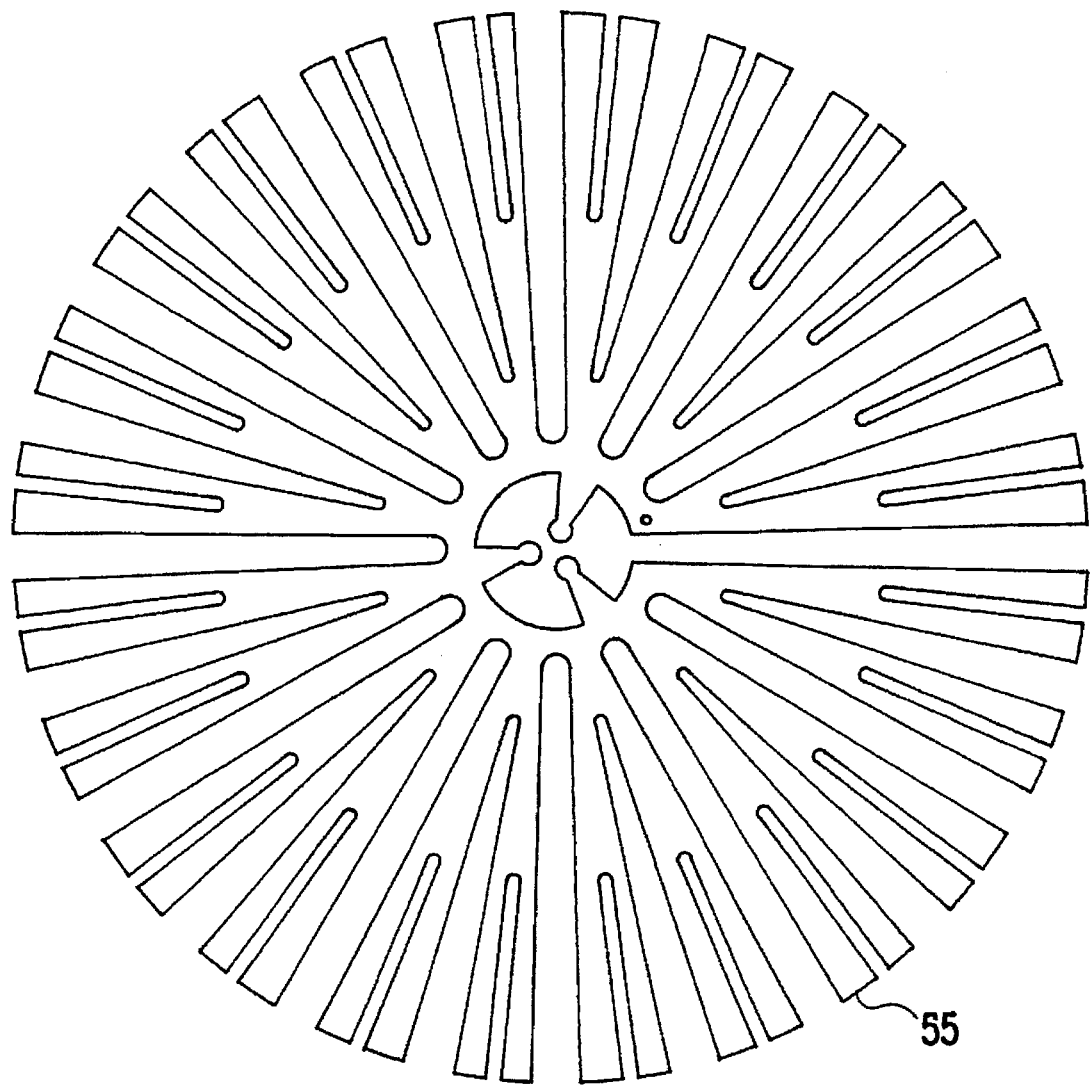
FIG. 9 is a plan view of the Faraday shield used in the second embodiment.

FIG. 8 shows the fourth embodiment of the invention as a modification of the first embodiment in which the second RF spiral coil 4 is replaced by a Faraday shield 55, shown in more detail in FIG. 9. The Faraday shield 55 is electrically connected to the high voltage end of the RF spiral coil 3. This Faraday shield is electrically attached to the high voltage end of the coil, thus maximizing the amount of capacitive coupling. By varying the reactive coupling of the coil to ground, the RF voltage on the Faraday shield can be adjusted to the desired value for the plasma process. The design of the Faraday shield is important. It does not "steal" current from the induction coil, which leads to nonuniformities in the inductive coupling. In a preferred design, the connection point to the coil is placed off center, leading to improved uniformity. As one modification, the Faraday shield 55 is driven by a variable reactance 56 and grounded by another variable reactance 57, allowing the Faraday shield drive to be controlled.

The invention thus employs an RF coil which is built in layers above or outside of the dielectric window which separates the coil from the plasma. Alternatively, the layered coil structure may be placed within the plasma chamber. The layers in each of the embodiments are separated preferably by an insulator with a low dielectric constant, producing a coil with high "Q" without affecting the voltage which the plasma "sees". For more pure inductive plasmas, the low voltage (symmetrically driven) end of the coil is placed nearest the plasma. When more capacitive coupling is desired, the higher voltage end is placed nearest the plasma. The additional turns of the RF coil takes the place of the large inductor which is presently in the matching network. Since the outer turn is nearly circular, running from the bottom layer to the next layer, the theta variation of the induced plasma is much smaller.

This invention is applicable to solenoid type ICP, planar ICP as well as internal coils. For internal coils, tubes of different diameter can be used coaxially, as described. Instead of the spirals shown for the planar coils, other shapes can be used such as connected circles.

While the invention has been described in terms of a two preferred embodiments with modifications, those skilled in the art will recognize that the invention can be practiced with modification within the spirit and scope of the appended claims.

Having thus described our invention, what we claim as new and desire to secure by Letters Patent is as follows:

1. An apparatus for producing an inductive plasma used for plasma processing of a workpiece, comprising:

a vacuum chamber including means within said chamber to receive a workpiece to be processed by a plasma;

an RF induction coil structure formed of at least first and second layers separated by an insulator of sufficient thickness to prevent electrical breakdown within the coil structure;

an RF source connected to said first layer of said RF induction coil structure, said RF induction coil structure generating an inductive plasma within said vacuum chamber when energized by said RF source; and a reactive impedance connected to said second layer of said RF induction coil structure and isolating the RF induction coil structure from ground, said reactive impedance controlling the amount of RF voltage on the layer closest to the plasma.

2. An apparatus as recited in claim 1 wherein said first and second layers of the RF coil structure are planar coils.

3. An apparatus as recited in claim 2 wherein said first and said second planar coils are spiral coils directly connected together at respective ends on respective outer portions thereof to form a nearly circular outer turn.

4. An apparatus as recited in claim 2 wherein said first and said second planar coils are spiral coils connected together with a capacitor.

5. An apparatus as recited in claim 4 wherein said capacitor is a lumped capacitor.

6. An apparatus as recited in claim 4 wherein said capacitor is a distributed capacitance.

7. An apparatus as recited in claim 2 wherein said planar coils are first and second spiral coils, said first spiral coil having one half more turn at its center than said second spiral coil.

8. An apparatus as recited in claim 2 wherein said planar coils are first and second spiral coils, at least one of said first and second spiral coils is a double spiral coil having first and second arms, ends of each of said first and second arms being connected to the other of said second or first spiral coils.

9. An apparatus as recited in claim 2 wherein low voltage ends of said planar coils are located nearest a plasma in said vacuum chamber to provide more inductive coupling to the plasma.

10. An apparatus as recited in claim 2 wherein high voltage ends of said planar coils are located nearest a plasma in said vacuum chamber to provide more capacitive coupling to the plasma.

11. An apparatus as recited in claim 1 wherein said first and said second layers are connected together with a capacitor to provide capacitive coupling to a plasma in said vacuum chamber.

12. An apparatus as recited in claim 11 wherein said capacitor is a lumped capacitor.

13. An apparatus as recited in claim 11 wherein said capacitor is a distributed capacitance between said first and second layers, said distributed capacitance forming a slow wave structure producing an electric field in a radial direction of the plasma.

14. An apparatus as recited in claim 1 wherein said first and second layers of the RF coil structure are solenoid coils.

15. An apparatus as recited in claim 14 wherein the first layer of the RF coil structure is a planar coil and the second layer is a Faraday shield.

16. An apparatus as recited in claim 15 wherein a high voltage connection of said Faraday shield is electrically connected to a high voltage end of said planar coil by a first variable reactance and a low voltage connection of said Faraday shield is electrically connected to ground by a second variable reactance.

17. An apparatus as recited in claim 1 wherein said RF induction coil structure is positioned within said vacuum chamber, said first and second layers of the RF induction coil structure being driven in series.

18. An apparatus as recited in claim 17 wherein said first and second layers of the RF induction coil structure are coaxial tubes.

19. An apparatus as recited in claim 18 wherein RF voltage on an outer one of said coaxial tubes is held to a minimum to reduce capacitance coupling of the RF induction coil structure to the plasma.

20. An apparatus as recited in claim 18 wherein said insulator is recessed from an end of one of said coaxial tubes to form a shadowing structure to prevent conduction between the layers.

21. A method of providing a controlled capacitive coupling in an inductively driven plasma in a plasma processing apparatus comprising the steps of:

building a layered RF inductive coil structure including at least first and second layers separated by an insulator having a low dielectric constant and a sufficient thickness to prevent electrical breakdown within the coil structure;

placing a low voltage end of said layered RF inductive coil structure nearest the plasma for a more inductive coupling to the plasma;

placing a high voltage end of said layered RF inductive coil structure nearest the plasma for a more capacitive coupling to the plasma;

connecting a reactive impedance to said second layer of said RF inductive coil structure to isolate the RF induction coil structure from ground, said reactive impedance controlling the amount of RF voltage on the layer closest to the plasma; and energizing the layered RF inductive coil structure with an RF source to generate the plasma.

22. The method of claim 21 wherein said first and second layers are spiral coils further comprising the step of connecting outer ends of said first and second spiral coils.

23. The method of claim 22 wherein the step of connecting comprises directly connecting said outer ends with a nearly circular turn.

24. The method of claim 22 wherein the step of connecting comprises connecting said outer ends with a capacitor.

25. The method of claim 22 wherein the first and second spiral coils are connected by a distributed capacitance to form a slow wave structure to produce an electric field in a radial direction of the plasma.

26. The method of claim 21 wherein said first and second layers are solenoid coils, further comprising the step of connecting the two solenoid coils with a capacitor.

* * * * *